United States Patent
Zolotow et al.

(10) Patent No.: US 11,662,933 B2
(45) Date of Patent: May 30, 2023

(54) DATACENTER RELOCATION UTILIZING STORAGE CARRIERS AND ERASURE CODING

(71) Applicant: Kyndryl, Inc., New York, NY (US)

(72) Inventors: Clea A. Zolotow, Key West., FL (US); Gavin C. O'Reilly, Kilcoole (IE); John V. Delaney, Kildalkey (IE); Anthony Hunt, Hopewell Junction, NY (US); Tedrick N. Northway, Alachua, FL (US)

(73) Assignee: KYNDRYL, INC., New York, NY (US)

( * ) Notice: Subject to any disclaimer, the term of this patent is extended or adjusted under 35 U.S.C. 154(b) by 455 days.

(21) Appl. No.: 16/169,337

(22) Filed: Oct. 24, 2018

(65) Prior Publication Data

US 2020/0133552 A1    Apr. 30, 2020

(51) Int. Cl.
*G06F 3/06* (2006.01)
*B64C 39/02* (2023.01)
*H03M 13/37* (2006.01)

(52) U.S. Cl.
CPC .......... *G06F 3/0647* (2013.01); *B64C 39/024* (2013.01); *G06F 3/067* (2013.01); *G06F 3/0614* (2013.01); *H03M 13/373* (2013.01); *B64C 2201/145* (2013.01)

(58) Field of Classification Search
None
See application file for complete search history.

(56) References Cited

U.S. PATENT DOCUMENTS

| | | | |
|---|---|---|---|
| 4,562,534 A | 12/1985 | Zandveld et al. | |
| 5,475,706 A | 12/1995 | Kobayashi et al. | |
| 6,834,326 B1 | 12/2004 | Wang et al. | |
| 8,261,033 B1 | 9/2012 | Slik et al. | |
| 8,473,578 B2 | 6/2013 | Frank et al. | |
| 9,059,960 B2 | 6/2015 | Burchfield et al. | |
| 2009/0007207 A1* | 1/2009 | Kashalkar | H04N 21/4382 725/113 |
| 2014/0337336 A1 | 11/2014 | Carlson | |
| 2016/0092801 A1 | 3/2016 | Carden et al. | |
| 2016/0191365 A1 | 6/2016 | Wakeman et al. | |
| 2017/0153829 A1* | 6/2017 | Patel | G06F 3/061 |

(Continued)

OTHER PUBLICATIONS

"Silly window syndrome", Wikipedia, From Wikipedia, the free encyclopedia, This page last edited on Dec. 29, 2016, 2 pages, <https://en.wikipedia.org/wiki/Silly_window_syndrome>.

(Continued)

*Primary Examiner* — Kris E Mackes
*Assistant Examiner* — Soheila (Gina) Davanlou
(74) *Attorney, Agent, or Firm* — Dan Housley; George S. Blasiak; Heslin Rothernberg Farley Mesiti P.C.

(57) ABSTRACT

Computer implemented systems and methods for migrating datacenter data include providing a quantity of carriers having a data storage capacity, receiving, by the quantity of carriers, a quantity of data stored in a first data storage system having a first location and including erasure coded data blocks. The quantity of carriers migrates to a second data storage system having a second location; and transmits the quantity of data to the second data storage system.

20 Claims, 5 Drawing Sheets

(56) References Cited

U.S. PATENT DOCUMENTS

| | | | | |
|---|---|---|---|---|
| 2017/0238234 | A1* | 8/2017 | Dowlatkhah | H04W 48/20 |
| | | | | 455/517 |
| 2017/0270314 | A1* | 9/2017 | Tsybrovskyy | G06F 11/1458 |
| 2018/0173442 | A1* | 6/2018 | Kirkpatrick | G06F 3/0683 |
| 2018/0241503 | A1* | 8/2018 | Harper | H03M 13/154 |
| 2018/0365106 | A1* | 12/2018 | Huang | G06F 3/0635 |
| 2020/0039645 | A1* | 2/2020 | Soryal | B64C 39/024 |

OTHER PUBLICATIONS

"Swarm robotics", From Wikipedia, the free encyclopedia. This page was last edited on Sep. 17, 2018, 4 pages, <https://en.wikipedia.org/wiki/Swarm_robotics>.

Barrett, Brian, "Inside the Olympics Opening Ceremony World-Record Drone Show", GEAR, Feb. 9, 2018, 08:00 pm, 8 pages.

Cuadra et al., "How drones are controlled", The Washington Post, Published Jun. 20, 2014, 5 pages, <http://www.washingtonpost.com/wp-srv/special/national/drone-crashes/how-drones-work/?noredirect=on>.

Plank, James S., "Erasure Codes for Storage Systems—a Brief Primer", Dec. 2013, vol. 38, No. 6, pp. 44-50, www.usenix.org.

Rouse, Margaret, "Definition—iSCSI (Internet Small Computer System Interface)", SAN technology and arrays, Internet technologies, This was last updated in Oct. 2014, 6 pages, <https://searchstorage.techtarget.com/definition/iSCSI>.

Teodoro, Irwin, "Data Center Relocation: Tips for Success", Network Computing, Jun. 3, 2014, 7:00 AM, 11 pages.

Wang et al., "IP SAN—From iSCSI to IP-Addressable Ethernet Disks", MSS '03, Proceedings of the 20th IEEE/11th NASA Goddard Conference on Mass Storage Systems and Technologies, Apr. 7-10, 2003, 7 pages.

* cited by examiner

DATACENTER RELOCATION UTILIZING STORAGE CARRIERS AND ERASURE CODING

BACKGROUND

The disclosure relates generally to migrating data between datacenters and specifically to utilizing storage carriers and erasure coding in migrating the data.

Networked computer systems benefit from the existence of data centers where information is centrally located for access by network users. Datacenters include networked as well as individual storage devices accessible remotely over communications links.

SUMMARY

Aspects of the invention include methods, systems, and computer readable media for transferring data from a first datacenter to a second datacenter by providing a quantity of carriers having a data storage capacity, receiving a quantity of data stored in a first data storage system having a first location, by the quantity of carriers, wherein the quantity of data comprises erasure coded data blocks, migrating the quantity of carriers to a second data storage system having a second location; and transmitting, the erasure coded data blocks to the second data storage system.

DETAILED DESCRIPTION

Figure 1:
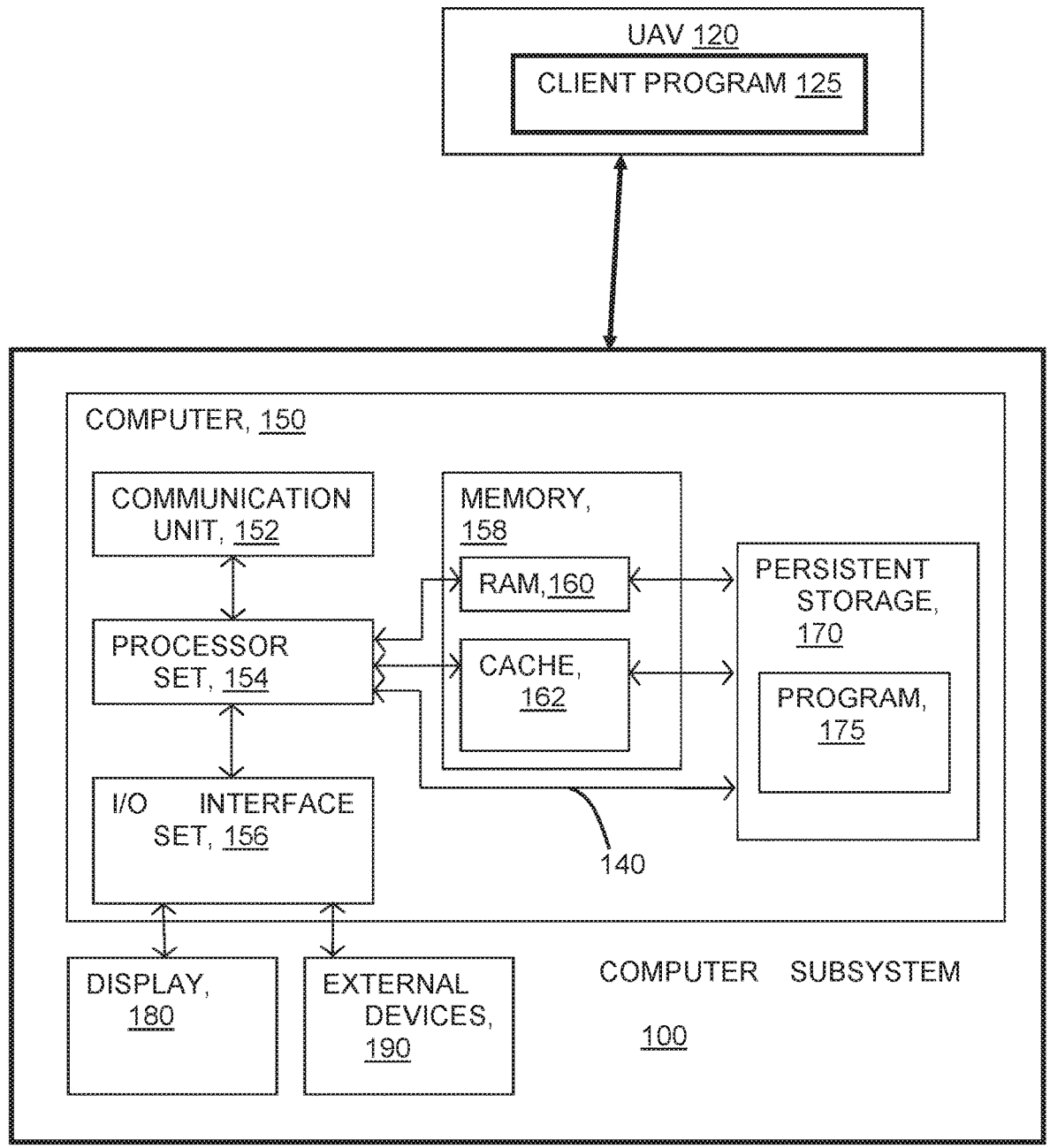
FIG. 1 provides a schematic illustration of system components, according to an embodiment of the invention.

Establishing a new datacenter entails the transfer of data from an existing datacenter to the new facility. The undertaking carries with it an inherent risk of data loss. The data transfer may be accomplished using telecommunications links between the two datacenters, (when such links are available) with the risk of data loss in transmission, or by the physical relocation of data storage equipment from an existing datacenter to a new datacenter (aka: lift and shift) which carries the accompanying risk of data loss due to equipment damaged while being handled and in transit.

There are global datacenter locations where adequate migration telecommunications are non-existent and the transportation infrastructure represents a significant risk for datacenter equipment involved in a lift and shift migration.

Transferring data to a new datacenter by either utilizing telecommunications systems or physically disassembling and the reassembling data storage systems, such as storage area network (SAN) components is known. A copy of the data may be transferred utilizing conventional means such as helicopters or trucks but those means carry a risk of data loss in the event a vehicle is lost. Data transfers to a remotely located data center lacking access to good roads or suitable telecommunications require a transfer method independent of road or telecommunications infrastructure.

The disclosed methods, products and systems may be applied to the migration of data from a first data storage system to a second data storage system. Data storage systems include storage area networks (SANs), virtual storage area networks (vSANs) as well as local disks. Without intending to limit the disclosed inventions, the embodiments disclosed herein refer specifically to the migration of data from a first SAN to a second SAN. The embodiments are also applicable to other types of data storage systems.

In an embodiment, data is to be transferred from a first SAN at a first location to a second SAN at a second location to establish the second SAN for use. A SAN administrator may initiate a method for the transfer. The method determines the quantity of data presently stored in the first SAN. The stored data may be block, object, fiber, or other digital data. The determination may be achieved using SAN operating system data storage utility software functions. After the data quantity is determined, the number of carriers needed for a successful migration is determined.

The carriers may comprise network storage devices in conjunction with unpiloted aerial vehicles (UAV) with each UAV comprising sufficient payload capacity to carry network storage devices having data storage capacity to carry a portion of the data. The carriers may include solid state or disk drive data storage systems. The carriers comprise a network interface for the receipt and transmission of stored data. The carriers comprise computer systems including power supplies to maintain the storage devices in an active state during transit. The network drives maintain communications with each other using wireless communications protocols such as WiFi. In an embodiment, the UAVs comprise automated guidance systems based upon the use of global positioning system (GPS) coordinates to control the flight path of the UAV. In an alternative embodiment, the UAVs may be remotely piloted. The set of carrier UAVs may be controlled (either remotely or automatically) as a group.

FIG. 1 provides a schematic illustration of a computer system 1000 adapted for use in support of the disclosed methods. The illustrated details are applicable to datacenter systems as well as data carrier systems. As shown in the figure, computer subsystem 100 may be connected to UAV system 120. UAV system 120 comprises a client data transfer program 125 including programmed instructions which perform operational aspects of the disclosed methods. Computer subsystem 100, equally applicable to datacenter systems and UAV systems, includes computer 150 which in turn can include processor(s) 154, memory 158, comprising random access memory (RAM) 160 and cache memory 162, persistent storage 170, communications unit 152, input/output (I/O) interface(s) 156 and communications fabric 140. Communications fabric 140 provides communications between cache 162, memory 158, persistent storage 170, communications unit 152, and input/output (I/O) interface(s) 156. Communications fabric 140 can be implemented with any architecture designed for passing data and/or control information between processors (such as microprocessors, communications and network processors, etc.), system memory, peripheral devices, and any other hardware components within a system. For example, communications fabric 140 can be implemented with one or more buses.

Memory 158 and persistent storage 170 are computer readable storage media. In this embodiment, memory 158 includes random access memory (RAM). In general, memory 158 can include any suitable volatile or non-volatile computer readable storage media. Cache 162 is a fast memory that enhances the performance of processor(s) 154 by holding recently accessed data, and data near recently accessed data, from memory 158.

Program instructions and data used to practice embodiments of the present invention, e.g., the data transfer program 175, are stored in persistent storage 170 for execution and/or access by one or more of the respective processor(s) 154 of server computer 150 via cache 162. In this embodiment, persistent storage 170 includes a magnetic hard disk drive. Alternatively, or in addition to a magnetic hard disk drive, persistent storage 170 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 170 may also be removable. For example, a removable hard drive may be used for persistent storage 170. Other examples include optical and magnetic disks, thumb drives, and smart cards that are inserted into a drive for transfer onto another computer readable storage medium that is also part of persistent storage 170.

Communications unit 152, in these examples, provides for communications with other data processing systems or devices, In these examples, communications unit 152 includes one or more network interface cards. Communications unit 152 may provide communications through the use of either or both physical and wireless communications links. Software distribution programs, and other programs and data used for implementation of the present invention, may be downloaded to persistent storage 170 of server computer 150 through communications unit 152.

I/O interface(s) 156 allows for input and output of data with other devices that may be connected to server computer 150. For example, I/O interface(s) 156 may provide a connection to external device(s) 190 such as a keyboard, a keypad, a touch screen, a microphone, a digital camera, and/or some other suitable input device. External device(s) 190 can also include portable computer readable storage media such as, for example, thumb drives, portable optical or magnetic disks, and memory cards. Software and data used to practice embodiments of the present invention, e.g., data transfer program 175 on server computer 150, can be stored on such portable computer readable storage media and can be loaded onto persistent storage 170 via I/O interface(s) 156. I/O interface(s) 156 also connect to a display 180.

Display 180 provides a mechanism to display data to a user and may be, for example, a computer monitor. Display 180 can also function as a touch screen, such as a display of a tablet computer.

In an embodiment, determining the number of necessary carriers takes into consideration the enlargement of the original data set by an erasure coding of the data set and also includes a number of substitute carriers having additional data storage capacity but initially containing no data from the migrating data set. In this embodiment, the number of determined carriers is greater than the minimum number of carriers needed to match the determined data storage capacity. In an embodiment, the number of substitute carriers is determined based upon predicted UAV reliability over the transit path considering the length, geography, and typical weather patterns associated with the transit path as well as the value of the data to be transmitted and may be implemented as a percentage of the minimum number of carriers needed to accommodate the number of erasure coded data blocks. The loss percentage is determined by the user. The loss percentage may be as low as 0% for test data and may range as high as 100% for important data.

The data of the first datacenter is erasure coded to reduce the effect of any data lost in transit. Erasure coding translates the original data into an expanded data set which may be reconstructed even in the event of lost or corrupted data. The erasure coded set is larger than the original set. Suitable erasure coding methods include virtually translating the data to a redundant array of independent disks (RAID) structure including RAID 4, RAID 5, RAID 6 and higher-level RAID structures, fountain and Reed-Solomon codes to yield erasure coded data blocks from the original data set. In an embodiment, each erasure coded data block is assigned an internet protocol (IP) address yielding a packet comprising the IP address and a payload of the erasure coded data block. The erasure coding and IP address assignments for the data blocks may be accomplished suing a RAID data controller, which may be either a hardware or software controller, or using preconfigured scripts created using data management software such as open source data utility rsync, or similar data utility software programs, and other data management utilities.

The RAID or erasure coding controller may be integrated into the hardware of the SAN or may be present as a separate appliance connected to the SAN and to the set of carrier drives. The data set of the SAN is erasure coded and provided with IP addresses at the data block level as it is transmitted from the SAN to the carrier. Transmission to the erasure coding controller may be managed by data controller software including loss recovery features. Transmission from the erasure coding controller to the carriers is accomplished using User Datagram Protocol (UDP) network interface using a wired internet protocol (IP) connection between the SAN and the carrier, as the packets now include data loss recovery features due to the erasure coding. Use of the UDP/IP without data recovery in transit enables a higher data transfer rate to the carriers.

The erasure coded data blocks, including their IP addresses, are transmitted to the individual carriers such that the set of carriers contains all the stored data blocks. The set of erasure coded blocks may be transmitted to the carriers from the erasure coding controller using a data transfer protocol such as the internet small computer system interface (iSCSI), or the internet file communications protocol (IFCP), over a UDP, or any appropriate data migration methodology. The erasure coded blocks may be encrypted during transmission using encryption technology such as Datagram Transport Layer Security (DTLS). None of the erasure coded data blocks are transmitted to the designated substitute carriers.

The complete set of carriers is migrated from the first SAN location to the second SAN location. In an embodiment, the migration occurs with the set of UAV carriers flying to the second SAN. The distribution of erasure coded data blocks across a set of carriers diminishes the impact of data loss associated with the loss of a single carrier UAV. As the data blocks are erasure coded, the data lost due to the loss of a UAV may be reconstructed from the remaining erasure coded blocks. The set of carriers may be migrated using GPS data for the first and second SAN locations to determine and execute one or more flight paths for the set of carriers. The set of carriers may include spare or substitute carriers having storage capacity but containing no data blocks.

Contact is maintained at least between the individuals of the set of UAVs using a wireless protocol such as WiFi and may also be maintained between the set of UAVs and external administrators overseeing the migration. In an embodiment, the loss of any particular UAV and its accompanying data results in a reconstruction of the lost data. In this embodiment, the remaining UAVs recognize the loss of the UAV and data. The recognition of lost data may be achieved via a database of UAV data manifests maintained by each UAV or by a query among the UAVs of remaining IP addresses providing an indication of missing IP addresses. The data blocks associated with the missing IP addresses are then reconstructed using the erasure coding features of the remaining data blocks with a substitute UAV or UAVs providing the storage space to hold the reconstructed blocks. The reconstruction occurs over the wireless connection using TCP/IP over the wireless channel to provide data loss protection during the reconstruction of the missing data blocks. In this embodiment, the reconstruction occurs actively in transit such that the set of UAVs arrives at the location of the second SAN carrying an intact set of erasure coded data blocks.

After the set of carriers arrive at the second SAN, and any necessary data reconstruction has occurred, the data is transmitted from the UAVs to the SAN again using data transfer applications over iSCSI or iFCP over a UDP network connection as described above or using other data migration methodologies. The transmitted data may be encrypted in transit using encryption technology such as Datagram Transport Layer Security (DTLS). The data blocks are received by a hardware or software-based erasure coding appliance and reverse erasure coding of the blocks proceeds. After the transferred data blocks are transmitted to, and received by, the second SAN, checksum (CRC) checks are performed to ensure that data errors have not been introduced in the transfer of the data. The IP addresses of the received data blocks enables the reconstruction of the full data set in the proper order such that reverse erasure coding may be achieved. The reverse erasure coding yields the original data set which is stored in the second SAN.

Figure 2:
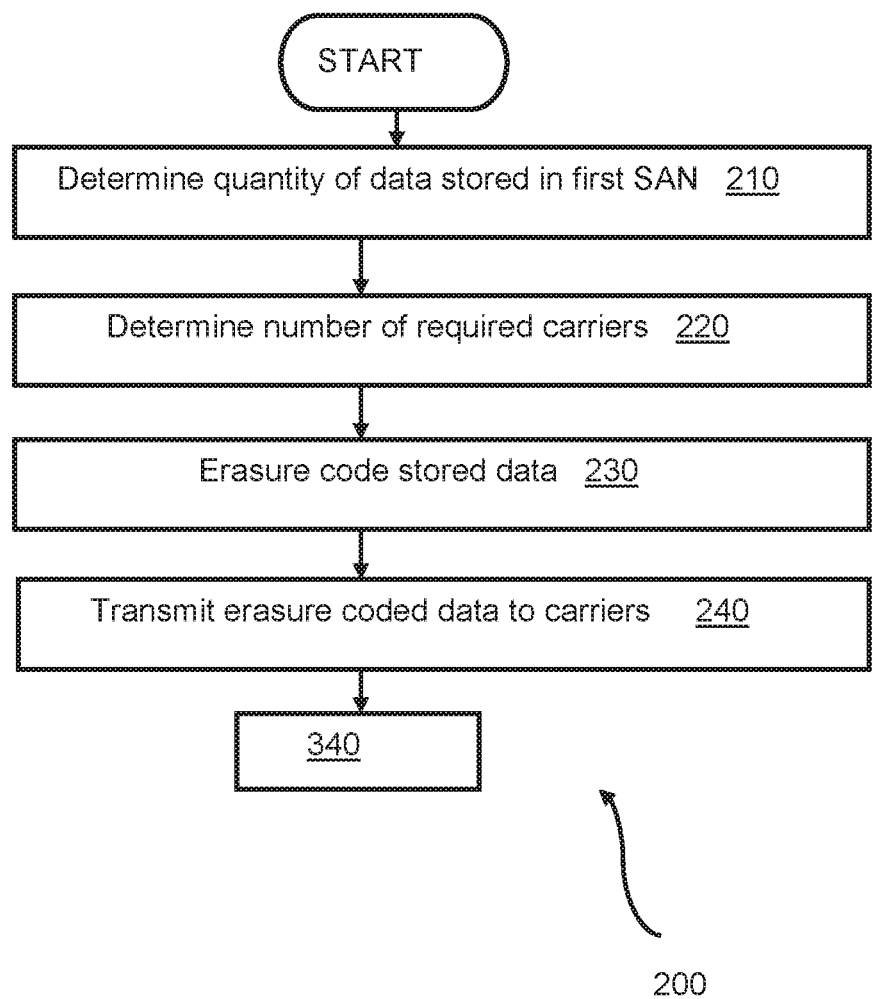
FIG. 2 provides a flowchart depicting the logical execution of steps, according to an embodiment of the invention.

In an embodiment, beginning with the flowchart 200 of FIG. 2, a method proceeds by one or more computer processors determining the quantity of data stored in the first SAN in need of migration at step 210. In response to the determination at 210, at 220, the number of carriers needed to migrate the quantity of data of step 210 is determined by one or more computer processors as a function of the quantity of data, the selected erasure coding methodology, the sensitivity of the data, and the predicted carrier loss percentage. At step 230, the migrating data set is erasure coded and provided IP addresses by one or more computer processors. At step 240, the blocks of step 230 are transmitted to the carriers over a UDP/IP connection using iSCSI, iFCP or other data transfer protocols by one or more computer processors.

Figure 3:
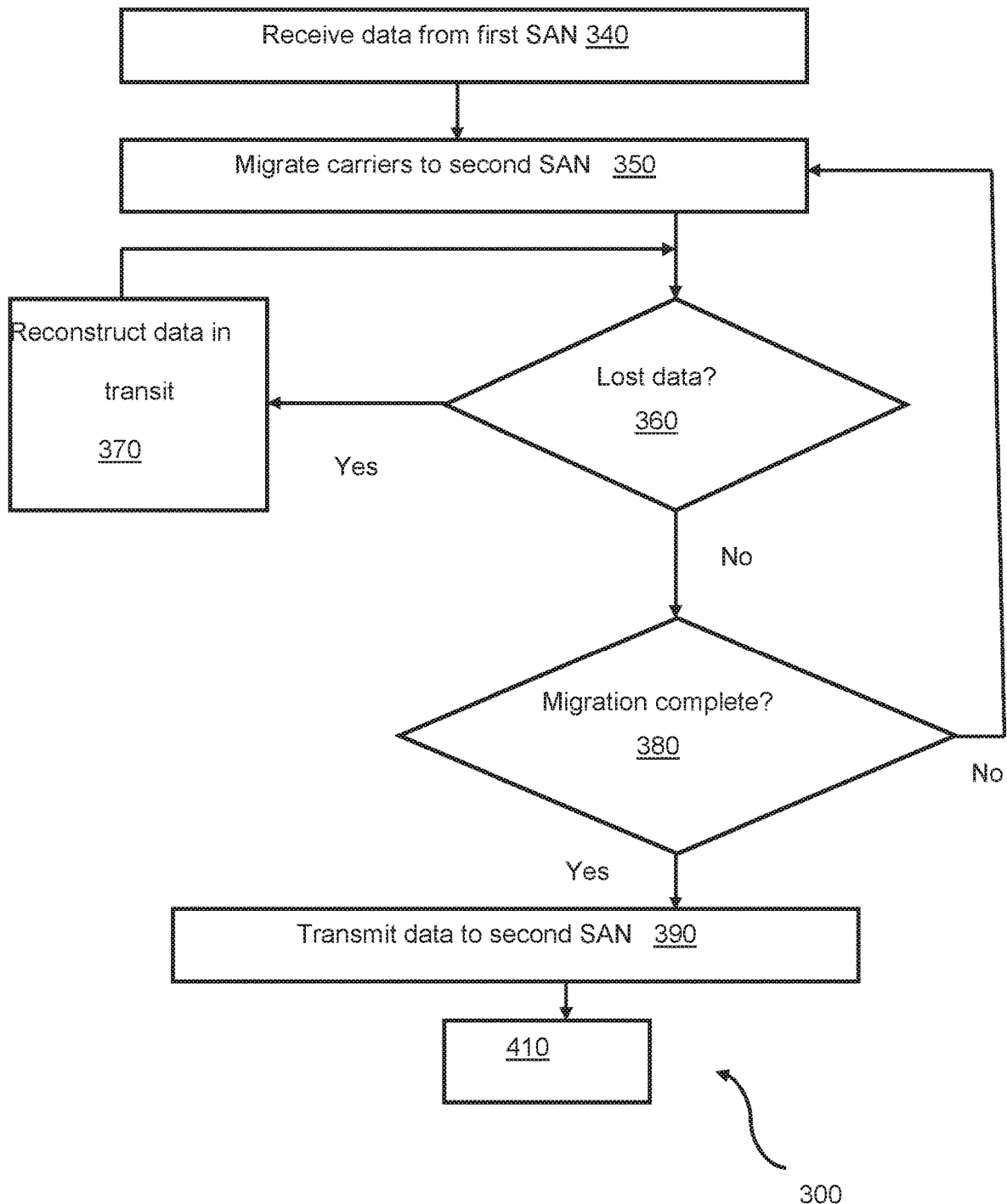
FIG. 3 provides a flowchart depicting the logical execution of steps, according to an embodiment of the invention.

At step 340, of flowchart 300 illustrated in FIG. 3, the carriers receive the data set from the first datacenter. At 350, the carriers begin migrating to the second SAN location. In transit, and until the carriers are connected to the network of the second SAN, a check is made for lost carriers and accompanying lost data at step 360 by carrier computer processors. If a data loss is detected, the lost data is reconstructed by the remaining carrier computer processors using erasure coding features of the remaining data blocks and TCP/IP transfer protocols over wireless inter-UAV connections at step 370. After the data has been reconstructed the program returns to instruction 360. If no data loss is detected, a check is made at 380 to determine if the carriers have arrived at the second SAN. If arrival has not occurred, the program returns to step 350. As or after the carriers arrive at the second SAN location, the erasure coded blocks are transmitted to an erasure coding controller using iSCSI, iFCP, or other protocols, over a UDP/IP connection at 390.

Figure 4:
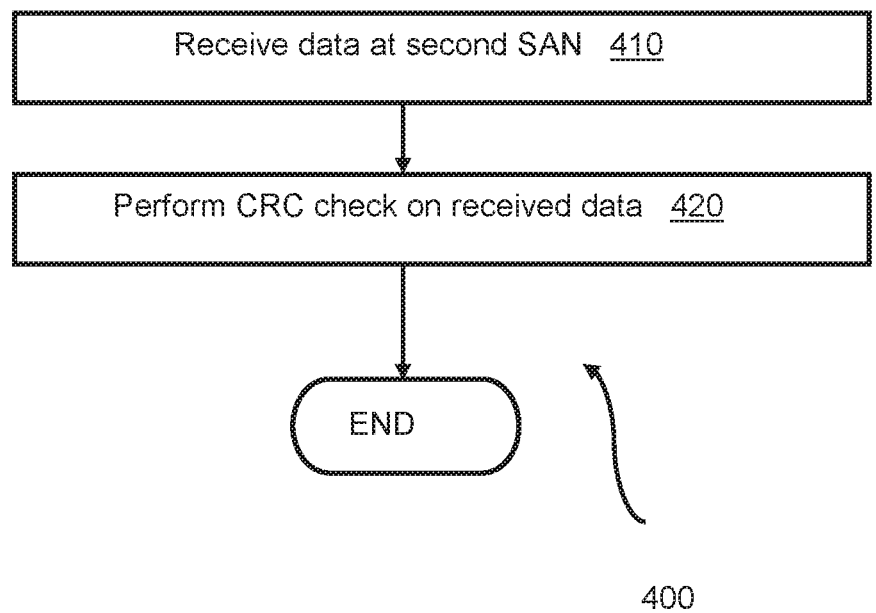
FIG. 4 provides a flowchart depicting the logical execution of steps, according to an embodiment of the invention.

The flowchart 400 of FIG. 4 illustrates the receipt of the data set from the carriers at 410. The erasure coded data blocks are assembled into a complete data set according to their IP addresses by one or more computer processors associated with the second SAN. A checksum or CRC may be performed by one or more computer processors upon the received blocks to identify and correct any transmission errors. The erasure coded blocks are then reverse erasure coded by one or more computer processors yielding the original data at step 420.

In an exemplary embodiment, a first data center comprises 2048 terra bytes (TB) of stored data to be moved to a second data center. RAID 6 storage is used to enhance the security of the data against loss during the transfer. IP addresses are assigned to each RAID 6 data block. The translation of the original data to a RAID 6 format increases the size of the data to 2112 TB. A minimum fleet of 66 storage carriers each having a storage capacity of 32 TB is necessary to hold the RAID 6 data. A loss factor of 10% is applied to the minimum fleet size resulting in an actual fleet size of 73 carriers each having a capacity of 32 TB (66 data carriers and 7 substitute carriers initially containing no data). The loss factor is determined by the user, in this example the loss factor of 10% reflects the anticipated carrier loss quantity as well as considering the sensitivity of the data. After the data is copied to the carriers, the migration to the second data center begins as the fleet of carriers flies to the second data center. During the migration, the fleet checks for lost carriers/data. After a carrier is detected as lost, the data blocks stored on the missing carrier are reconstructed from the remaining data blocks utilizing the RAID 6 data reconstruction protocol. The reconstructed data blocks are stored on a substitute carrier. The reconstruction and storage on the substitute carrier are accomplished using wireless communications linkages. In this embodiment, reconstruction in transit of any single missing carrier reduces the likelihood of a situation where the data associated with two or more carriers are lost at the same time. The reconstruction increases the likelihood that a complete data set is delivered to the second data center at the end of the migration. After the fleet arrives at the second data center, the 2112 TB of data are transferred to the second data center using a iSCSI or iFCP over a UDP connection. The data blocks are ordered using the assigned IP addresses. A CRC may be performed upon the transferred data to check for errors.

Figure 5:
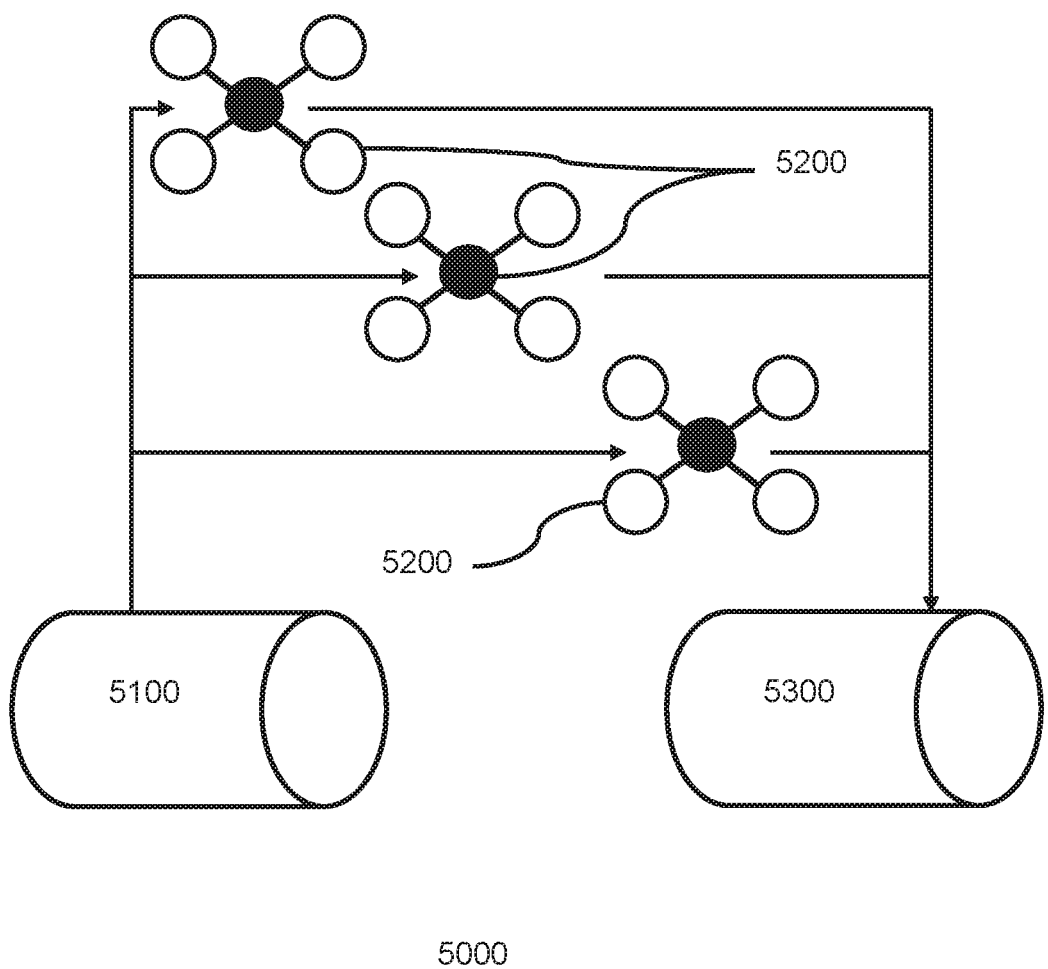
FIG. 5 provides a schematic view of elements of a system, according to an embodiment of the invention.

In an embodiment illustrated in FIG. 5, a system 5000 to support the disclosed inventions comprises a source datacenter SAN 5100. The source SAN 5100 may comprise an erasure coding appliance (not shown) adapted to erasure code the SAN data and assign IP addresses to the erasure coded data blocks. The system may further comprise a plurality of carriers 5200 adapted to receive data from the source SAN 5100, and to migrate from a source SAN 5100 location to a destination SAN 5300 location. The destination SAN 5300 comprises an erasure coding appliance (not shown) adapted to receive the erasure coded blocks from the carriers 5200, and to reverse erasure code the blocks yielding the original data set from the source SAN 5100.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for migrating data, the method comprising:
providing a quantity of carriers having a data storage capacity;
receiving, by the quantity of carriers, a quantity of data stored in a first data storage system having a first location, wherein the quantity of data comprises erasure coded data blocks;
migrating the quantity of carriers to a second data storage system having a second location;
during the migrating the quantity of carriers to the second data storage system having the second location, monitoring for the loss of a carrier;
in response to determining from the monitoring that a certain carrier of the quantity of carriers is missing, reconstructing data blocks stored on the certain carrier using a reconstruction protocol and storing the reconstructed data blocks on a substitute carrier; and
transmitting, by the quantity of carriers including the substitute carrier, the erasure coded data blocks to the second data storage system.

2. The method according to claim 1 wherein providing a quantity of carriers having a data storage capacity comprises providing a quantity of carriers having a data storage capacity greater than the quantity of data stored in the first data storage system.

3. The method according to claim 1 wherein receiving the erasure coded data blocks by the quantity of carriers comprises receiving the erasure coded data blocks using a data transfer protocol selected from the group consisting of: iSCSI (Internet Small Computer System Interface) over a UDP (User Datagram Protocol) network, and iFCP (Internet File Communications Protocol) over a UDP network.

4. The method according to claim 1 wherein migrating the quantity of carriers to a second data storage system includes flying a set of carriers from the first location to the second location.

5. The method according to claim 1 further comprising receiving destination GPS (Global Positioning System) coordinates for the second location by the set of carriers.

6. The method according to claim 1 wherein receiving, by the quantity of carriers, a quantity of data stored in a first data storage system having a first location, wherein the quantity of data comprises erasure coded data blocks includes receiving, by the quantity of carriers, a quantity of data stored in a first data storage system having a first location, wherein the quantity of data comprises erasure coded data blocks having an IP (Internet Protocol) address assigned to each erasure coded data block.

7. The method according to claim 1 further comprising reconstructing a portion of the erasure coded data blocks as the quantity of carriers are migrating from the first data storage system to the second data storage system.

8. The method of claim 1, wherein the reconstructing data blocks stored on the certain carrier using a reconstruction protocol is performed with carriers of the quantity of carriers in transit from the first data storage system to the second data storage system.

9. The method of claim 1, wherein the reconstructing data blocks stored on the certain carrier using the reconstruction protocol includes reconstructing the data blocks from remaining data blocks utilizing the RAID 6 data reconstruction protocol.

10. The method of claim 1, wherein the reconstructing data blocks stored on the certain carrier using a reconstruction protocol is performed with carriers of the quantity of carriers in transit from the first data storage system to the second data storage system, and wherein the reconstructing data blocks stored on the certain carrier using the reconstruction protocol includes reconstructing the data blocks from remaining data blocks utilizing the RAID 6 data reconstruction protocol.

11. The method of claim 1, wherein providing a quantity of carriers having a data storage capacity comprises providing a quantity of carriers having a data storage capacity greater than the quantity of data stored in the first data storage system, wherein receiving the erasure coded data blocks by the quantity of carriers comprises receiving the erasure coded data blocks using a data transfer protocol selected from the group consisting of: iSCSI (Internet Small Computer System Interface) over a UDP (User Datagram Protocol) network, and iFCP (Internet File Communications Protocol) over a UDP network, wherein migrating the quantity of carriers to a second data storage system includes flying a set of carriers from the first location to the second location, wherein receiving, by the quantity of carriers, a quantity of data stored in a first data storage system having a first location, wherein the quantity of data comprises erasure coded data blocks includes receiving, by the quantity of carriers, a quantity of data stored in a first data storage system having a first location, wherein the quantity of data comprises erasure coded data blocks having an IP (Internet Protocol) address assigned to each erasure coded data block, wherein the method includes reconstructing a portion of the erasure coded data blocks as the quantity of carriers are migrating from the first data storage system to the second data storage system, wherein the reconstructing data blocks stored on the certain carrier using a reconstruction protocol is performed with carriers of the quantity of carriers in transit from the first data storage system to the second data storage system, and wherein the reconstructing data blocks stored on the certain carrier using the reconstruction protocol includes reconstructing the data blocks from remaining data blocks utilizing the RAID 6 data reconstruction protocol.

12. The method of claim 1, wherein the method includes maintaining network connectivity between carriers of the quantity of carriers during the migrating of the quantity of carriers to the second data storage system having the second location, wherein the monitoring for the loss of the carrier includes respective ones of the quantity of carriers, with carriers of the quantity of carriers in transit from the first data storage system to the second data storage system, querying network addresses of remaining carriers of the quantity of carriers, and wherein the respective carriers of the quantity of carriers ascertain that the certain carrier is missing when, as a result of the querying the network addresses of remaining carriers of the quantity of carriers, a certain network address of the certain carrier is determined to be missing.

13. The method of claim 1, wherein providing a quantity of carriers having a data storage capacity comprises providing a quantity of carriers having a data storage capacity greater than the quantity of data stored in the first data storage system, wherein receiving the erasure coded data blocks by the quantity of carriers comprises receiving the erasure coded data blocks using a data transfer protocol selected from the group consisting of: iSCSI (Internet Small Computer System Interface) over a UDP (User Datagram Protocol) network, and iFCP (Internet File Communications Protocol) over a UDP network, wherein migrating the quantity of carriers to a second data storage system includes flying a set of carriers from the first location to the second location.

14. A computer system for migrating data, the computer system comprising: one or more computer processors; one or more computer readable storage devices; and program instructions stored on the one or more computer readable storage devices for execution by at least one of the one or more computer processors, the program instructions executable for performance of the method comprising:
providing a quantity of carriers having a data storage capacity;
receiving, by the quantity of carriers, a quantity of data stored in a first data storage system having a first location, wherein the quantity of data comprises erasure coded data blocks;
migrating the quantity of carriers to a second data storage system having a second location; during the migrating the quantity of carriers to the second data storage system having the second location, monitoring for the loss of a carrier;
in response to determining from the monitoring that a certain carrier of the quantity of carriers is missing, reconstructing data blocks stored on the certain carrier using a reconstruction protocol and storing the reconstructed data blocks on a substitute carrier; and
transmitting, by the quantity of carriers including the substitute carrier, the erasure coded data blocks to the second data storage system.

15. The system of claim 14, wherein the reconstructing data blocks stored on the certain carrier using a reconstruction protocol is performed with carriers of the quantity of carriers in transit from the first data storage system to the second data storage system.

16. The system of claim 14, wherein the reconstructing data blocks stored on the certain carrier using the reconstruction protocol includes reconstructing the data blocks from remaining data blocks utilizing the RAID 6 data reconstruction protocol.

17. The system of claim 14, wherein the reconstructing data blocks stored on the certain carrier using a reconstruction protocol is performed with carriers of the quantity of carriers in transit from the first data storage system to the second data storage system, and wherein the reconstructing data blocks stored on the certain carrier using the reconstruction protocol includes reconstructing the data blocks from remaining data blocks utilizing the RAID 6 data reconstruction protocol.

18. The system of claim 14, wherein providing a quantity of carriers having a data storage capacity comprises providing a quantity of carriers having a data storage capacity greater than the quantity of data stored in the first data storage system.

19. The system of claim 14, wherein migrating the quantity of carriers to a second data storage system includes flying a set of carriers from the first location to the second location.

20. A computer program product for migrating data, the computer program product comprising one or more computer readable storage devices and program instructions stored on the one or more computer readable storage devices, the program instructions executable for performance of the method comprising:
providing a quantity of carriers having a data storage capacity;
receiving, by the quantity of carriers, a quantity of data stored in a first data storage system having a first location, wherein the quantity of data comprises erasure coded data blocks;
migrating the quantity of carriers to a second data storage system having a second location;
during the migrating the quantity of carriers to the second data storage system having the second location, monitoring for the loss of a carrier;
in response to determining from the monitoring that a certain carrier of the quantity of carriers is missing, reconstructing data blocks stored on the certain carrier using a reconstruction protocol and storing the reconstructed data blocks on a substitute carrier; and
transmitting, by the quantity of carriers including the substitute carrier, the erasure coded data blocks to the second data storage system,
wherein receiving, by the quantity of carriers, a quantity of data stored in a first data storage system having a first location, wherein the quantity of data comprises erasure coded data blocks includes receiving, by the quantity of carriers, a quantity of data stored in a first data storage system having a first location, wherein the quantity of data comprises erasure coded data blocks having an IP (Internet Protocol) address assigned to each erasure coded data block, wherein the method includes reconstructing a portion of the erasure coded data blocks as the quantity of carriers are migrating from the first data storage system to the second data storage system, wherein the reconstructing data blocks stored on the certain carrier using a reconstruction protocol is performed with carriers of the quantity of carriers in transit from the first data storage system to the second data storage system, and wherein the reconstructing data blocks stored on the certain carrier using the reconstruction protocol includes reconstructing the data blocks from remaining data blocks utilizing the RAID 6 data reconstruction protocol, wherein the method includes maintaining network connectivity between carriers of the quantity of carriers during the migrating of the quantity of carriers to the second data storage system having the second location, wherein the monitoring for the loss of the carrier includes respective ones of the quantity of carriers, with carriers of the quantity of carriers in transit from the first data storage system to the second data storage system, querying network addresses of remaining carriers of the quantity of carriers, and wherein the respective carriers of the quantity of carriers ascertain that the certain carrier is missing when, as a result of the querying the network addresses of remaining carriers of the quantity of carriers, a certain network address of the certain carrier is determined to be missing.

* * * * *